US011257537B2

(12) United States Patent
Jung

(10) Patent No.: US 11,257,537 B2
(45) Date of Patent: Feb. 22, 2022

(54) VOLTAGE GENERATOR CIRCUITRY OF MEMORY DEVICE FOR GENERATING AN INTERNAL POWER SUPPLY VOLTAGE AND METHODS OF OPERATING THE SAME

(71) Applicant: Samsung Electronics Co., Ltd., Suwon-si (KR)

(72) Inventor: Sanghoon Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/034,058

(22) Filed: Sep. 28, 2020

(65) Prior Publication Data

US 2021/0225422 A1 Jul. 22, 2021

(30) Foreign Application Priority Data

Jan. 20, 2020 (KR) .................. 10-2020-0007386

(51) Int. Cl.
*G11C 5/14* (2006.01)
*G11C 11/4074* (2006.01)
*G11C 11/4091* (2006.01)
*G11C 11/4094* (2006.01)

(52) U.S. Cl.
CPC .......... *G11C 11/4074* (2013.01); *G11C 5/147* (2013.01); *G11C 5/148* (2013.01); *G11C 11/4091* (2013.01); *G11C 11/4094* (2013.01)

(58) Field of Classification Search
CPC .................. G11C 11/4074; G11C 11/4091
See application file for complete search history.

(56) References Cited

U.S. PATENT DOCUMENTS

| 6,034,563 | A | 3/2000 | Mashiko |
| 7,084,667 | B2 | 8/2006 | Bernstein et al. |
| 7,092,307 | B2 | 8/2006 | Chen et al. |
| 7,158,423 | B2* | 1/2007 | Seo .......................... G11C 5/14 365/189.09 |
| 7,256,644 | B2 | 8/2007 | Ooishi et al. |
| 7,379,373 | B2 | 5/2008 | Lorenz et al. |
| 7,864,599 | B2 | 1/2011 | Chang et al. |
| 2005/0259497 | A1 | 11/2005 | Choi |
| 2006/0250179 | A1* | 11/2006 | Lee ......................... G05F 1/465 327/541 |

(Continued)

FOREIGN PATENT DOCUMENTS

JP    3633061 B2    3/2005

*Primary Examiner* — Mushfique Siddique
(74) *Attorney, Agent, or Firm* — Muir Patent Law, PLLC

(57) ABSTRACT

Provided are a voltage generator circuitry for generating an internal power supply voltage of a memory device and an operation method thereof. In the memory device, a voltage generator circuitry generates a first internal power supply voltage when the memory device is in an active mode, generates a second internal power supply voltage when the memory device is in a standby mode, and provides the first internal power supply voltage or the second internal power supply voltage to an internal power supply voltage line for using as an internal power supply voltage of the memory device. When the memory device is in the standby mode, the voltage generator circuitry blocks generation of the first internal power supply voltage by using a first voltage higher than an external power supply voltage.

19 Claims, 6 Drawing Sheets

(56) References Cited

U.S. PATENT DOCUMENTS

| | | | |
|---|---|---|---|
| 2009/0207674 A1* | 8/2009 | Chang | G11C 5/147 |
| | | | 365/189.09 |
| 2013/0223175 A1* | 8/2013 | Lee | G11C 5/147 |
| | | | 365/228 |
| 2016/0027495 A1* | 1/2016 | Kim | G11C 7/065 |
| | | | 365/149 |

* cited by examiner

VOLTAGE GENERATOR CIRCUITRY OF MEMORY DEVICE FOR GENERATING AN INTERNAL POWER SUPPLY VOLTAGE AND METHODS OF OPERATING THE SAME

CROSS-REFERENCE TO RELATED APPLICATION

This application claims the benefit of Korean Patent Application No. 10-2020-0007386, filed on Jan. 20, 2020, in the Korean Intellectual Property Office, the disclosure of which is incorporated herein in its entirety by reference.

BACKGROUND

The inventive concept relates to a semiconductor memory device, and more particularly, to a voltage generator circuitry for generating an internal power supply voltage to be used to sense data of memory cells, and an operation method thereof.

Semiconductor memory devices, e.g., dynamic random access memory (DRAM), are being developed to have a high integration degree and large capacity. DRAM includes memory cells consisting of cell transistors and cell capacitors and operates to write and read data by electric charges stored in the cell capacitors. The memory cells may be connected to bit lines and complementary bit lines. In the DRAM, when a read operation or a refresh operation is performed, sense amplifiers sense and amplify a voltage difference between the bit lines and the complementary bit lines. Because the sense amplifiers sense voltages of many bit lines at once, the sense amplifiers use an internal power supply voltage for supplying a constant current during a sensing operation rather than an external power supply voltage applied from the outside. In order to constantly control sensing operations of the sense amplifiers, a voltage generator circuitry for stably generating the internal power supply voltage is desired.

SUMMARY

The inventive concept is directed to providing a voltage generator circuitry for generating an internal power supply voltage, an operation method thereof, and a memory device including the voltage generator circuitry.

According to an aspect of the inventive concept, a memory device for performing an operating mode according to a command includes a memory cell array including a plurality of memory blocks, each of which includes a plurality of memory cells connected to word lines and bit lines arranged in rows and columns, the memory cell array being configured to perform a write operation or a read operation on the plurality of memory cells by using an internal power supply voltage on an internal power supply voltage line; and a voltage generator circuitry configured to generate a first internal power supply voltage from an external power supply voltage when the memory device is in an active mode, generate a second internal power supply voltage from the external power supply voltage when the memory device is in a standby mode, and provide the first internal power supply voltage or the second internal power supply voltage to an internal power supply voltage line. When the memory device is in the standby mode, the voltage generator circuitry blocks generation of the first internal power supply voltage by using a first voltage higher than the external power supply voltage.

According to another aspect of the inventive concept, an operating method of a memory device configured to generate an internal power supply voltage includes, when the memory device is in an active mode, generating first and second internal power supply voltages from an external power supply voltage; when the memory device is in a standby mode and the active mode, generating the second internal power supply voltage from the external power supply voltage and blocking generation of the first internal power supply voltage by using a first voltage higher than the external power supply voltage.

According to another aspect of the inventive concept, a voltage generator circuitry for generating an internal power supply voltage of a memory device includes a first internal voltage generator circuit configured to compare a first internal power supply voltage with a reference voltage in response to a first drive control signal generated based on a first control signal activated in an active mode of the memory device, and generate a first internal power supply voltage to be equal to the reference voltage; a second internal voltage generator circuit configured, in the active mode and a standby mode of the memory device, to compare a second internal power supply voltage with the reference voltage and generate a second internal power supply voltage to be equal to the reference voltage; and a switch circuit configured to provide the first internal power supply voltage or the second internal power supply voltage to an internal power supply voltage line as the internal power supply voltage in response to a second control signal activated in the standby mode of the memory device.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
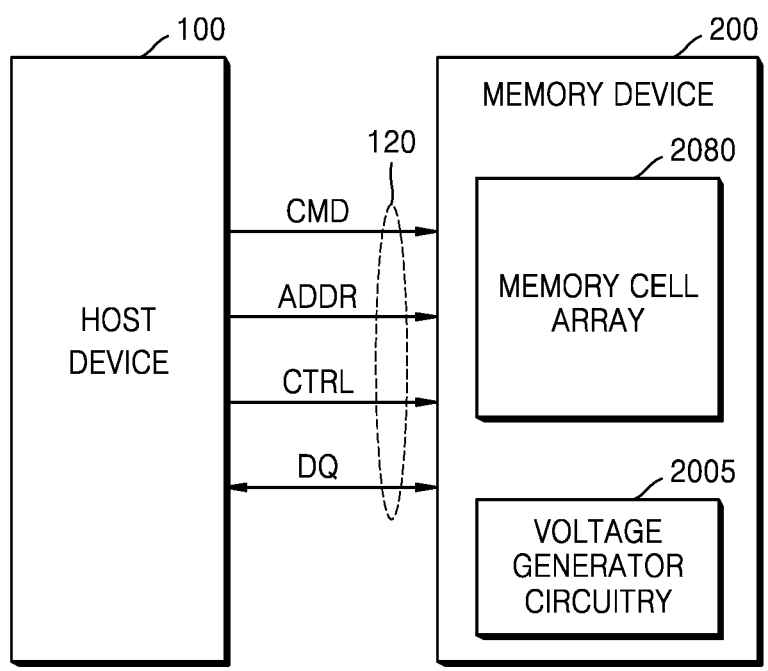
FIG. 1 is a diagram illustrating a system including a memory device according to example embodiments of the inventive concept.

Hereinafter, some example embodiments of the inventive concept will be described in detail with reference to the accompanying drawings. The same reference numbers are used to indicate similar or same items in different drawings. Subscripts added to reference numerals (e.g., "a" of 2005a, "a" of VINTAa, and "s" of VINTAs) are used to distinguish multiple circuits having the same function and multiple signals having the same function.

FIG. 1 is a diagram illustrating a system including a memory device according to example embodiments of the inventive concept.

Referring to FIG. 1, a system 10 may include a host device 100 and a memory device 200. The host device 100 may be communicatively connected to the memory device 200 via a bus 120.

As used herein, the memory device 200 (and others described herein) may refer to a device such as a semiconductor chip (e.g., memory chip and/or logic chip formed from a wafer) forming an integrated circuit, a stack of semiconductor chips, a semiconductor package including one or more semiconductor chips stacked on a package substrate, or a package-on-package device including a plurality of packages.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The host device 100 may be, for example, a computing system such as a computer, a laptop computer, a server, a workstation, a portable communication terminal, a personal digital assistant (PDA), a portable multimedia player (PMP), a smart phone, or a wearable device. Alternatively, the host device 100 may be part of components included in a computing system such as a graphics card. The host device 100 is a functional block which performs general computer operations in the system 10, and may be a central processing unit (CPU), a digital signal processor (DSP), and a graphics processing unit (GPU), or an application processor (AP).

The bus 120 may include signal lines for transmission of a command CMD, an address ADDR, and a control signal CTRL, and data lines for transmission of input/output data DQ. For the sake of brevity, the signal lines and the data lines between the host device 100 and the memory device 200 are illustrated as being connected via one signal line but may be actually connected via a plurality of signal lines.

The memory device 200 may write input/output data DQ or read data under control of the host device 100. For example, the memory device 200 may be a dynamic random access memory (DRAM) device. However, the scope of the inventive concept is not limited thereto, and the memory device 200 may be synchronous DRAM (SDRAM), double data rate SDRAM (DDR SDRAM), low power DDR SDRAM (LPDDR SDRAM), graphics DDR SDRAM (GDDR SDRAM), wide I/O DRAM, high bandwidth memory (HBM), a hybrid memory cube (HMC), or the like. In one embodiment, the memory device 200 may be one of non-volatile memory devices such as flash memory, phase-change RAM (PRAM), magnetic RAM (MRAM), resistive RAM (RRAM), and ferroelectric RAM (FRAM).

The memory device 200 may include a memory cell array 2080 and a voltage generator circuitry 2005. The memory cell array 2080 may include a plurality of memory blocks. Each of the plurality of memory blocks may include a plurality of memory cells connected to word lines and bit lines arranged in rows and columns. The memory cell array 2080 may be configured to perform a write operation or a read operation on the plurality of memory cells by using an internal power supply voltage generated by the voltage generator circuitry 2005. The voltage generator circuitry 2005 may generate a first internal power supply voltage from an external power supply voltage when the memory device 200 is in an active mode, generate a second internal power supply voltage from the external power supply voltage when the memory device 200 is in a standby mode, and apply the first internal power supply voltage or the second internal power supply voltage to an internal power supply voltage line.

Here, the standby mode may be at least one of a precharge mode, a power down mode, and a deep power down mode.

Figure 2:
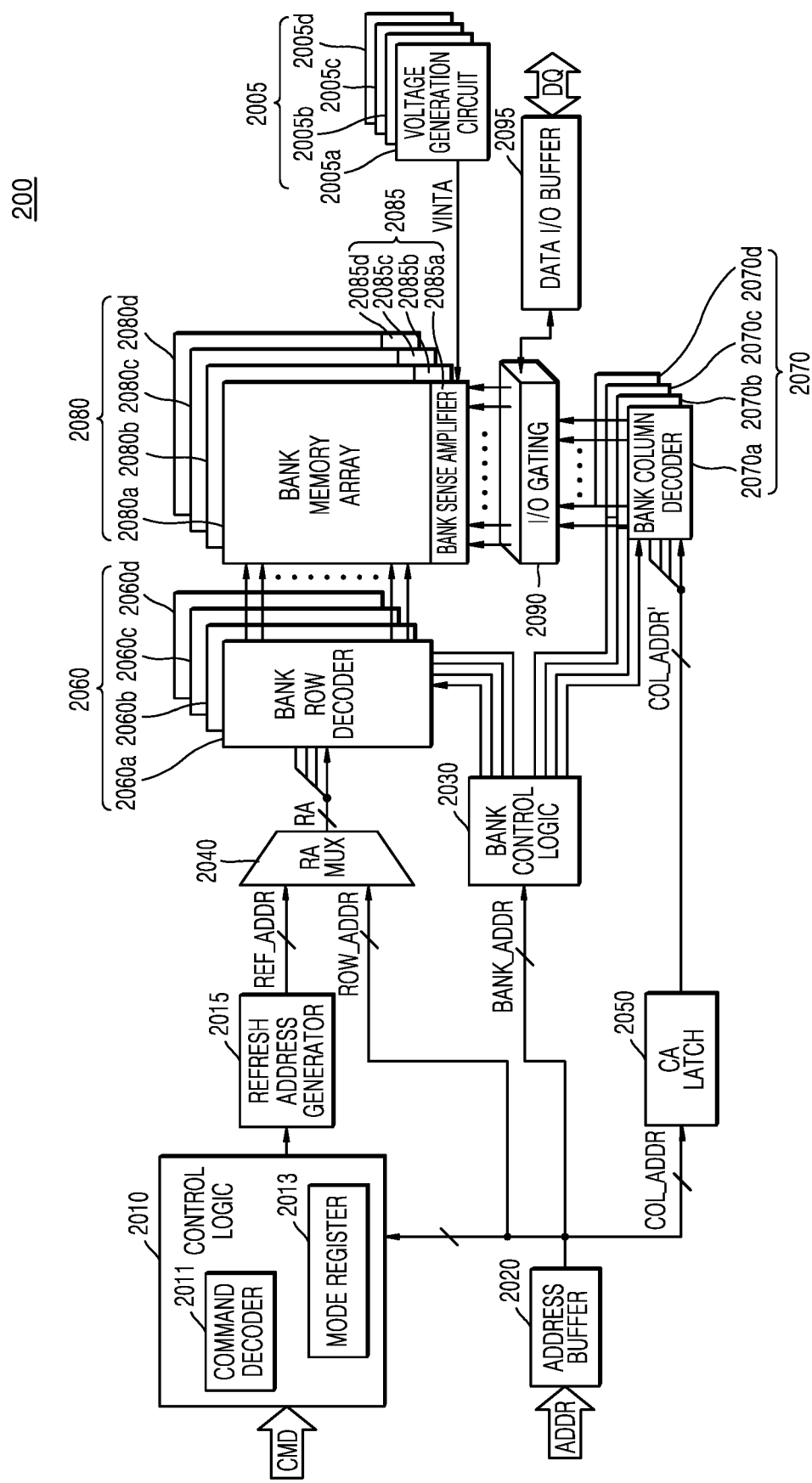
FIG. 2 is a block diagram illustrating a configuration of the memory device of FIG. 1 according to example embodiments of the inventive concept.

FIG. 2 is a block diagram illustrating a configuration of the memory device 200 of FIG. 1 according to example embodiments of the inventive concept. In the present embodiment, a case in which the memory device 200 is embodied as DRAM will be described.

Referring to FIG. 2, the memory device 200 may include a voltage generator circuitry 2005, a control logic 2010, a refresh address generator 2015, an address buffer 2020, a bank control logic 2030, a row address multiplexer 2040, a column address latch 2050, a row decoder 2060, a column decoder 2070, a memory cell array 2080, a sense amplifier unit 2085, an input/output gating circuit 2090, and a data input/output buffer 2095.

The memory cell array 2080 may include first to fourth bank memory arrays 2080a, 2080b, 2080c, and 2080d. Each of the first to fourth bank memory arrays 2080a, 2080b, 2080c, and 2080d may include a plurality of word lines, a plurality of bit lines, and a plurality of memory cells formed at intersections of the plurality of word lines and the plurality of bit lines.

The row decoder 2060 may include first to fourth bank row decoders 2060a, 2060b, 2060c, and 2060d connected to the first to fourth bank memory arrays 2080a, 2080b, 2080c, and 2080d, respectively. The column decoder 2070 may include first to fourth bank column decoders 2070a, 2070b, 2070c, and 2070d connected to the first to fourth bank memory arrays 2080a, 2080b, 2080c, and 2080d, respectively. The sense amplifier unit 2085 may include first to fourth bank sense amplifiers 2085a, 2085b, 2085c, and 2085d connected to the first to fourth bank memory arrays 2080a, 2080b, 2080c, and 2080d, respectively. For example, each of the first to fourth bank sense amplifiers 2085a, 2085b, 2085c, and 2085d may include bit line sense amplifiers. The voltage generator circuitry 2005 includes first to fourth voltage generation circuits 2005a, 2005b, 2005c, and 2005d connected to the first to fourth bank sense amplifiers 2085a, 2085b, 2085c, and 2085d, respectively.

The first to fourth bank memory arrays 2080a, 2080b, 2080c, and 2080d, the first to fourth bank row decoders 2060a, 2060b, 2060c, and 2060d, the first to fourth bank column decoders 2070a, 2070b, 2070c, and 2070d, the first to fourth bank sense amplifiers 2085a, 2085b, 2085c and 2085d, and the first to fourth voltage generation circuits 2005a, 2005b, 2005c and 2005d may form first to fourth memory banks. An example of the memory device 200 including four memory banks is illustrated in the present embodiment but the memory device 200 may include an arbitrary number of memory banks in example embodiments.

The control logic 2010 may control overall operations of the memory device 200. The control logic 2010 may generate control signals for controlling the memory device 200 to perform a write operation or a read operation. The control logic 2010 may include a command decoder 2011 for decoding a command CMD received from the host device 100 and a mode register 2013 for setting an operating mode of the memory device 200. The command decoder 2011 may generate control signals corresponding to the command CMD by decoding, for example, a write enable signal /WE, a row address strobe signal /RAS, a column address strobe signal /CAS, a chip selection signal /CS, and the like. The mode register 2013 may provide a plurality of operation options of the memory device 200 and program various functions, characteristics, and modes of the memory device 200.

The control logic 2010 may provide the voltage generator circuitry 2005 with control signals PVEB and PSW (see FIG. 3) generated based on the command CMD. The voltage generator circuitry 2005 may generate an internal power supply voltage VINTA in response to the control signals PVEB and PSW and apply the generated internal power supply voltage VINTA to the sense amplifier unit 2085. For example, the internal power supply voltage VINTA and a ground voltage VSS may be applied to LA and LAB lines of the bit line sense amplifier (not shown).

The control logic 2010 may control the refresh address generator 2015 to perform an auto refresh operation in response to a refresh command or to perform a self-refresh operation in response to a self-refresh entry command. The refresh address generator 2015 may generate a refresh address REF_ADDR corresponding to a row of a memory cell in which the refresh operation is to be performed. The refresh address generator 2015 may generate the refresh address REF_ADDR in each refresh cycle defined in a volatile memory device standard.

The address buffer 2020 may receive addresses ADDR including a bank address BANK_ADDR, a row address ROW_ADDR, and a column address COL_ADDR from the host device 100. In addition, the address buffer 2020 may provide the received bank address BANK_ADDR to the bank control logic 2030, the received row address ROW_ADDR to the row address multiplexer 2040, and the received column address COL_ADDR to the column address latch 2050.

The bank control logic 2030 may generate bank control signals in response to the bank address BANK_ADDR. In response to the bank control signals, a bank row decoder corresponding to the bank address BANK_ADDR among the first to fourth bank row decoders 2060a, 2060b, 2060c, and 2060d may be activated, a bank column decoder corresponding to the bank address BANK_ADDR among the first to fourth bank column decoders 2070a, 2070b, 2070c, and 2070d may be activated, and a voltage generation circuit corresponding to the bank address BANK_ADDR among the first to fourth voltage generation circuits 2005a, 2005b, 2005c, and 2005d may be activated.

The row address multiplexer 2040 may receive the row address ROW_ADDR from the address buffer 2020 and receive the refresh row address REF_ADDR from the refresh address generator 2015. The row address multiplexer 2040 may selectively output the row address ROW_ADDR or the refresh row address REF_ADDR according to an operating mode of the memory device 200. A row address RA output from the row address multiplexer 2040 may be applied to the first to fourth bank row decoders 2060a, 2060b, 2060c, and 2060d.

A bank row decoder activated by the bank control logic 2030 among the first to fourth bank row decoders 2060a, 2060b, 2060c, and 2060d may decode the row address output from the row address multiplexer 2040 to activate a word line corresponding to the row address. For example, the activated bank row decoder may apply a word line driving voltage to the word line corresponding to the row address.

The column address latch 2050 may receive the column address COL_ADDR from the address buffer 2020 and temporarily store the received column address COL_ADDR. The column address latch 2050 may incrementally increase the received column address COL_ADDR in a burst mode. The column address latch 2050 may apply the temporarily stored or incrementally increased column address COL_ADDR' to the first to fourth bank column decoders 2070a, 2070b, 2070c, and 2070d.

A bank column decoder activated by the bank control logic 2030 among the first to fourth bank column decoders 2070a, 2070b, 2070c, and 2070d may activate a bank sense amplifier of the bank sense amplifier unit 2085 corresponding to the bank address BANK_ADDR and the column address COL_ADDR through the input/output gating circuit 2090.

The input/output gating circuit 2090 may include circuits for gating input/output data DQ, an input data mask logic, read data latches for storing read data output from the first to fourth bank memory arrays 2080a, 2080b, 2080c, and 2080d, and a write driver for writing data to the first to fourth bank memory arrays 2080a, 2080b, 2080c, and 2080d.

Read data output from one of the first to fourth bank memory arrays 2080a, 2080b, 2080c, and 2080d may be sensed by sense amplifiers corresponding to one bank memory array and stored in the read data latches. Write data to be written to memory cells of one of the first to fourth bank memory arrays 2080a, 2080b, 2080c, and 2080d may be provided to the data input/output buffer 2095 from the host device 100. The write data provided to the data input/output buffer 2095 may be written to one of the first to fourth bank memory arrays 2080a, 2080b, 2080c, and 2080d through the write driver.

Figure 3:
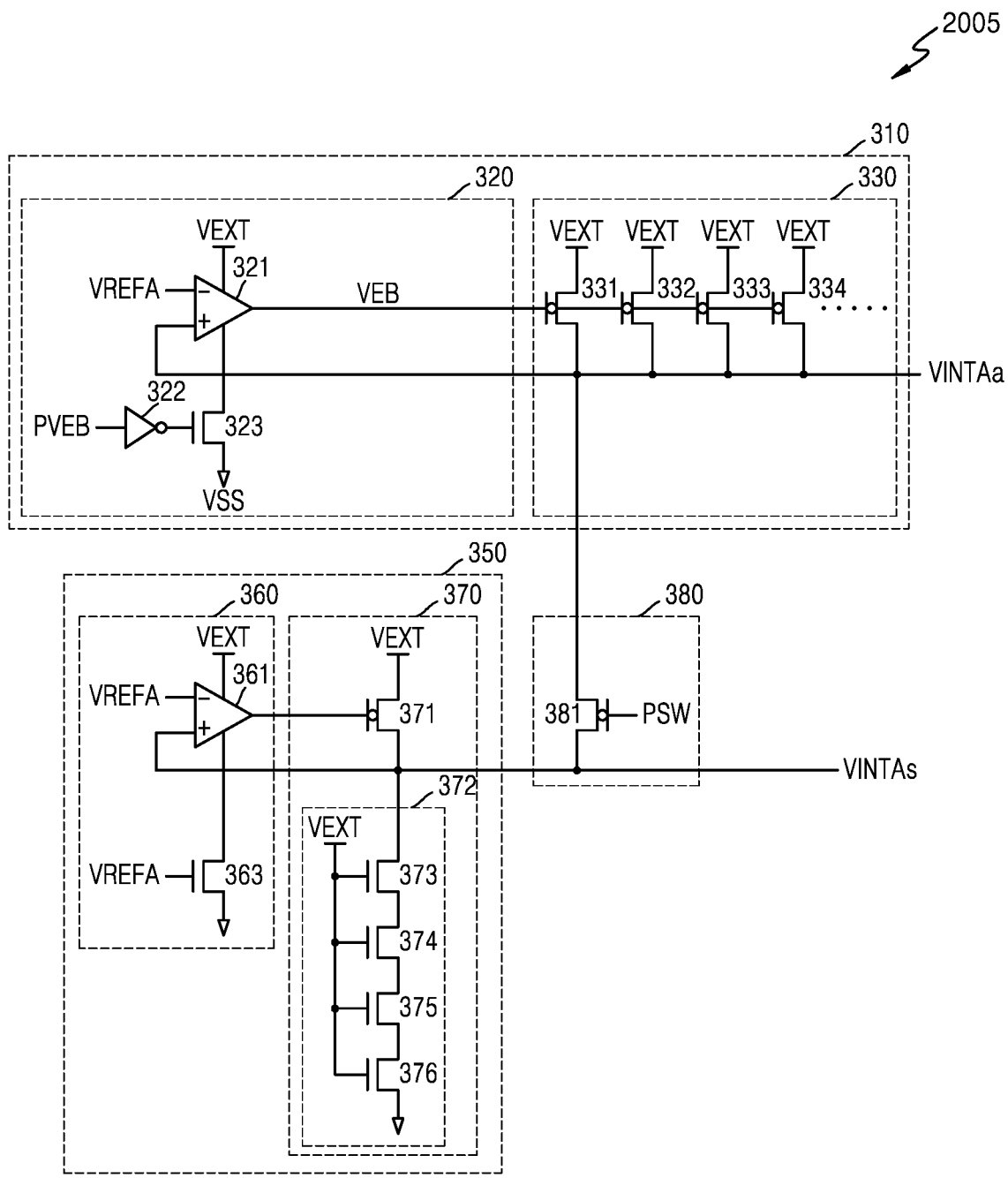
FIG. 3 is a diagram illustrating a configuration of a voltage generator circuitry according to example embodiments of the inventive concept.

FIG. 3 is a diagram illustrating a configuration of the voltage generator circuitry 2005 according to example embodiments of the inventive concept. The first to fourth voltage generation circuits 2005a, 2005b, 2005c, and 2005d respectively connected to the first to fourth bank sense amplifiers 2085a, 2085b, 2085c, and 2085d of FIG. 2 may be configured to be the same and thus will be hereinafter collectively referred to as the voltage generator circuitry 2005 for convenience of explanation.

Referring to FIG. 3, the voltage generator circuitry 2005 may generate an internal power supply voltage VINTA from an external power supply voltage VEXT supplied to the memory device 200, in response to first and second control signals PVEB and PSW. The first and second control signals PVEB and PSW may be provided from the control logic 2010, based on a command CMD.

The voltage generator circuitry 2005 may include a first internal voltage generator circuit 310 generating a first internal power supply voltage VINTAa, a second internal voltage generator circuit 350 generating a second internal power supply voltage VINTAs, and a switch circuit 380. The voltage generator circuitry 2005 may output the first internal power supply voltage VINTAa or the second internal power supply voltage VINTAs as an internal power supply voltage VINTA according to an operating mode of the memory device 200.

The first internal voltage generator circuit 310 may generate the first internal power supply voltage VINTAa and output it as the internal power supply voltage VINTA when the memory device 200 is in the active mode. The first internal voltage generator circuit 310 may include a first drive control circuit 320 and a first drive circuit 330.

The first drive control circuit 320 may include a first comparator 321, an inverter 322, and a first transistor 323. The first comparator 321 may be driven by an external power supply voltage VEXT and a ground voltage VSS, a reference voltage VREFA line may be connected to an inversion input terminal (−) thereof, and a first internal power supply voltage VINTAa line may be connected to a non-inversion input terminal (+) thereof. The first comparator 321 may compare a reference voltage VREFA with a first internal power supply voltage VINTAa and output a first drive control signal VEB as a result of the comparison. The first comparator 321 may be enabled when the first comparator 321 is connected to a ground voltage VSS line through the first transistor 323. The first transistor 323 may be an N-type metal oxide semiconductor (NMOS) transistor. The inverter 322 may receive the first control signal PVEB and provide an output to a gate of the first transistor 323. The first control signal PVEB may be activated to a logic low level when the memory device 200 is in the active mode and be deactivated to a logic high level when the memory device 200 is in the standby mode.

The first drive circuit 330 may include a plurality of first drive transistors 331 to 334 connected between the external power supply voltage VEXT line and the first internal power supply voltage VINTAa line. The first drive transistors 331 to 334 may be P-type metal oxide semiconductor (PMOS) transistors. A first drive control signal VEB output from the first drive control circuit 320 may be connected to gates of the first drive transistors 331 to 334.

In the first internal voltage generator circuit 310, when the memory device 200 is in the active mode, the first transistor 323 may be turned on by the first control signal PVEB that is at the logic low level and the first comparator 321 may be enabled. The first comparator 321 may compare the first internal power supply voltage VINTAa with the reference voltage VREFA and output the first drive control signal VEB. The first drive transistors 331 to 334 may generate the first internal power supply voltage VINTAa from the external power supply voltage VEXT, based on a voltage of the first drive control signal VEB.

For example, the first comparator 321 may output a first drive control signal VEB having a relatively low voltage when the first internal power supply voltage VINTAa is lower than the reference voltage VREFA. The first drive transistors 331 to 334 may be turned on by the first drive control signal VEB having a relatively low voltage, and a current may be supplied to the first internal power supply voltage VINTAa line through the first drive transistors 331 to 334 that are turned-on. The first internal power supply voltage VINTAa may increase according to the amount of current of the first driving transistors 331 to 334 that are turned-on. The amount of current supplied to the first internal power supply voltage VINTAa line may be used for a sensing operation of the sense amplifier unit 2085. Accordingly, it can be predicted that the sensing operation of the sense amplifier unit 2085 is constantly performed. Conversely, when the first internal power supply voltage VINTAa is higher than the reference voltage VREFA, the first comparator 321 may output a first drive control signal VEB having a relatively high voltage and the first drive transistors 331 to 334 may be turned off.

When the memory device 200 is in the active mode, the first internal voltage generator circuit 310 may generate the first internal power supply voltage VINTAa equal to the reference voltage VREFA through repetitively turning the first drive transistors 331 to 334 on or off and output the first internal power supply voltage VINTAa as the internal power supply voltage VINTA, thereby supplying a constant current during the sensing operation of the sense amplifier unit 2085.

When the memory device 200 is in the standby mode, in the first internal voltage generator circuit 310, the first transistor 323 may be turned off by the first control signal PVEB that is at the logic high level, the first comparator 321 may be disabled, and the first drive control signal VEB may be output as the external power supply voltage VEXT. The first drive transistors 331 to 334 may be turned off by the first drive control signal VEB having the external power supply voltage VEXT applied to the gates thereof. Accordingly, the first internal voltage generator circuit 310 does not generate the first internal power supply voltage VINTAa.

The second internal voltage generator circuit 350 may generate the second internal power supply voltage VINTAs and output it as the internal power supply voltage VINTA when the memory device 200 is in both the active mode and the standby mode. The second internal voltage generator circuit 350 may operate in both the active mode and the standby modes and include a second drive control circuit 360 and a second drive circuit 370.

The second drive control circuit 360 may include a second comparator 361 and a second transistor 363. The second comparator 361 may be configured to be the same as the first comparator 321. The second comparator 361 may be driven by the external power supply voltage VEXT and the ground voltage VSS, the reference voltage VREFA line may be connected to an inversion input terminal (−) thereof, and a second internal power supply voltage VINTAs line may be connected to a non-inversion input terminal (+) thereof. The second comparator 361 may compare the second internal power supply voltage VINTAs with the reference voltage VREFA and provide an output to the second drive circuit 370. The second comparator 361 may be connected to the ground voltage VSS line through the second transistor 363. The second transistor 363 may be an NMOS transistor in which the reference voltage VREFA line is connected to a gate thereof. The second transistor 363 may be always turned on and thus the second comparator 361 may be continuously enabled.

The second comparator 361 may output an output signal having a relatively low voltage when the second internal power supply voltage VINTAs is lower than the reference voltage VREFA. A second drive transistor 371 may be turned on by an output signal of the second comparator 361 having a relatively low voltage, and a voltage of the second internal power supply voltage VINTAs line may be increased through the second drive transistor 371 that is turned-on. Conversely, when the second internal power supply voltage VINTAs is higher than the reference voltage VREFA, the second comparator 361 may output an output signal having a relatively high voltage and the second drive transistor 371 may be turned off.

The second drive circuit 370 may include the second drive transistor 371 and a current sink unit 372, which are connected between the external power supply voltage VEXT line and the ground voltage VSS line. The second drive transistor 371 may be connected between the external power supply voltage VEXT line and the second internal power supply voltage VINTAs line, and the current sink unit 372 may be connected between the second internal power supply voltage VINTAs line and the ground voltage VSS line. The second drive transistor 371 may be a PMOS transistor in which an output of the second comparator 361 is connected to a gate thereof. The current sink unit 372 may include NMOS transistors 373 to 376 connected in series, and gates of the NMOS transistors 373 to 376 may be connected to the external power supply voltage VEXT line. The current sink unit 372 may be configured to supply a certain current so that the second internal power supply voltage VINTAs may be maintained not to be greater than the reference voltage VREFA, which is a target level.

The switch circuit 380 may selectively connect the first internal power supply voltage VINTAa line and the second internal power supply voltage VINTAs line, in response to the second control signal PSW. The switch circuit 380 includes a PMOS transistor 381 connected between the first internal power supply voltage VINTAa line and the second internal power supply voltage VINTAs line, and the second control signal PSW may be supplied to a gate of the PMOS transistor 381. The second control signal PSW may be deactivated to a logic high level when the memory device 200 is in the active mode and be activated to a logic low level when the memory device 200 is in the standby mode.

When the memory device 200 is in the active mode, the PMOS transistor 381 of the switch circuit 380 may be turned off in response to the second control signal PSW that is at the logic high level, thereby disconnecting the first internal power supply voltage VINTAa line and the second internal power supply voltage VINTAs line from each other. In the active mode of the memory device 200, the voltage generator circuitry 2005 may be configured in which the first internal power supply voltage VINTAa is generated by the first internal voltage generator circuit 310 and the second internal power supply voltage VINTAs is generated by the second internal voltage generator circuit 350 but the first internal power supply voltage VINTAa generated by the first internal voltage generator circuit 310 may be output and used as the internal power supply voltage VINTA.

Here, when the memory device 200 is in the active mode, the second internal power supply voltage VINTAs generated by the second internal voltage generator circuit 350 is not used as the internal power supply voltage VINTA. Nevertheless, the current sink unit 372 continuously supplies a certain current such that the second internal power supply voltage VINTAs may be maintained to be substantially the same as the reference voltage VREFA. This may be a burden on power consumption characteristics of the memory device 200.

When the memory device 200 is in the standby mode, the PMOS transistor 381 of the switch circuit 380 may be turned on in response to the second control signal PSW that is at the logic low level, thereby connecting the first internal power supply voltage VINTAa line and the second internal power supply voltage VINTAs line. The second internal power supply voltage VINTAs generated by the second internal voltage generator circuit 350 may be output and used as the internal power supply voltage VINTA. In this case, the first internal voltage generator circuit 310 may be disabled by the first control signal PVEB having the logic high level and the first drive transistors 331 to 334 may be turned off by the first drive control signal VEB having the external power supply voltage VEXT.

Here, although the first drive transistors 331 to 334 of the first internal voltage generator circuit 310 are turned off, a voltage of the first internal power supply voltage VINTAa may be increased due to leakage current flowing through the first drive transistors 331 to 334. The first internal power supply voltage VINTAa line, the voltage of which increases due to the leakage current may be connected to the second internal power supply voltage VINTAs line through the PMOS transistor 381 that is turned-on, and thus, the voltage thereof may be reduced by the current sink unit 372 of the second internal voltage generator circuit 350, which continuously supplies a certain current. Accordingly, the voltage of the first internal power supply voltage VINTAa line may be equal to the reference voltage VREFA of the second internal power supply voltage VINTAs line.

Referring to FIG. 3, power consumption of the memory device 200 may be increased due to the current sink unit 372 of the voltage generator circuitry 2005. In particular, as the number of memory banks of the memory device 200 increases, the number of voltage generator circuitries 2005 increases proportionally and thus the current sink unit 372 may not be suitable for a low power consumption memory device. In order to reduce power consumption, a method of omitting the current sink unit 372 may be used. A voltage generator circuitry that does not need the current sink unit 372 will be described below.

Figure 4:
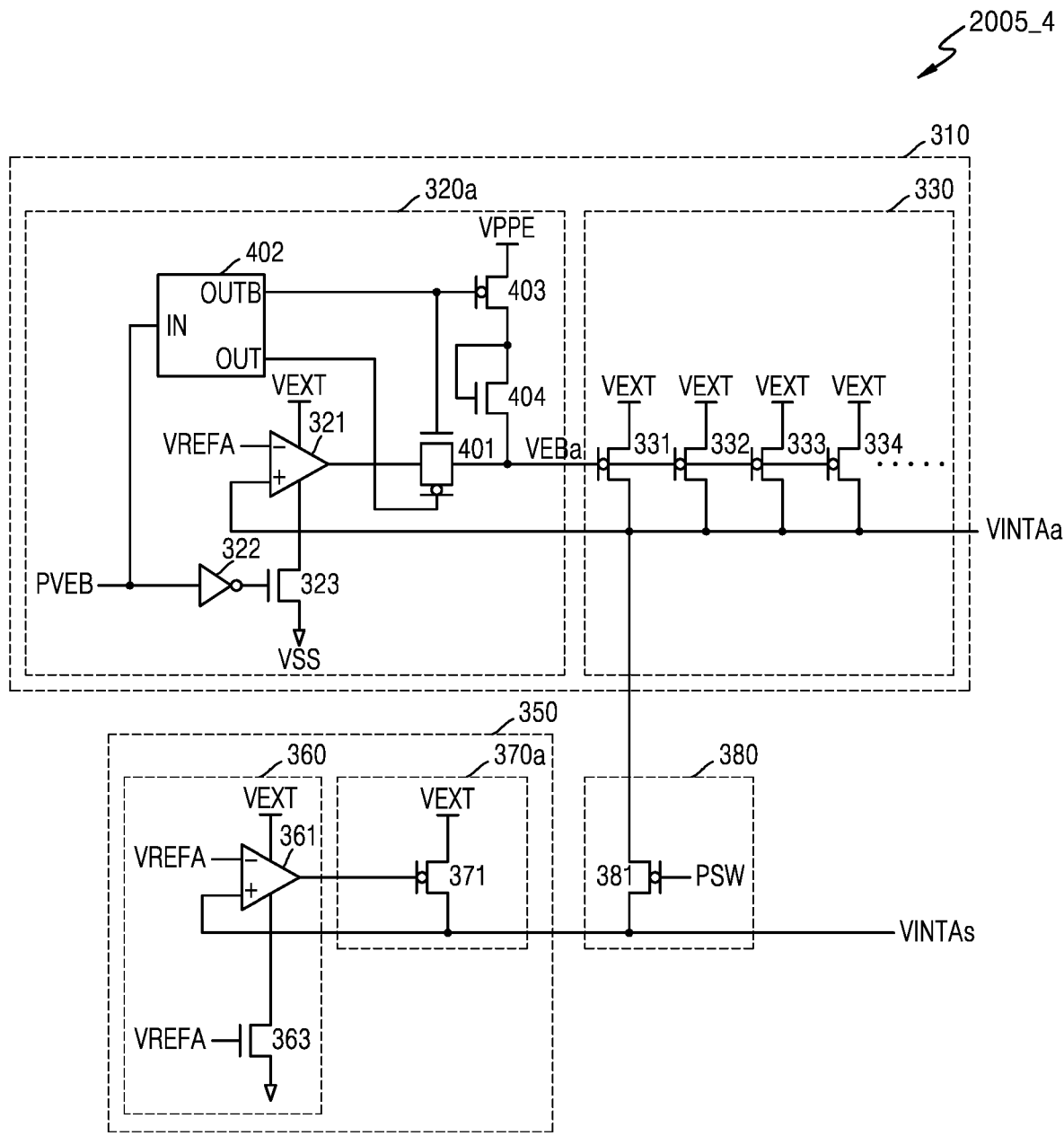
FIG. 4 is a diagram illustrating a configuration of a voltage generator circuitry according to example embodiments of the inventive concept.

FIG. 4 is a diagram illustrating a configuration of a voltage generator circuitry such as that of FIG. 2 according to example embodiments of the inventive concept. A voltage generator circuitry 2005_4 of FIG. 4 is different from the voltage generator circuitry 2005 of FIG. 3 in terms of configurations of a first drive control circuit 320a of a first internal voltage generator circuit 310 and a second drive control circuit 370a of a second internal voltage generator circuit 350. The first internal voltage generator circuit 310 may be included in each memory bank of the memory device 200 and one or more second internal voltage generator circuit 350 may be included in the memory device 200. FIG. 4 will be described focusing on differences with FIG. 3 below.

Referring to FIGS. 2 and 4, the first drive control circuit 320a may include a first comparator 321, an inverter 322, a first transistor 323, a transfer gate 401, a level shifter 402, a first PMOS transistor 403 and a second NMOS transistor 404. The inverter 322 may receive a first control signal PVEB and provide an output to a gate of the first transistor 323. The first comparator 321 may be driven by an external power supply voltage VEXT and a ground voltage VSS, a reference voltage VREFA line may be connected to an inversion input terminal (−) thereof, and a first internal power supply voltage VINTAa line may be connected to a non-inversion input terminal (+) thereof. The first comparator 321 may be enabled when the first comparator 321 is connected to a ground voltage VSS line through the first transistor 323. The first comparator 321 may compare a first internal power supply voltage VINTAa with a reference voltage VREFA and provide an output to the transfer gate 401.

A level shifter 402 may receive the first control signal PVEB that is activated to a logic low level as an input signal IN when the memory device 200 is in the active mode and that is deactivated to a logic high level as an input signal IN when the memory device 200 is in the standby mode. The logic high level of the first control signal PVEB provided from the control logic 2010 may be an external power supply voltage VEXT and the logic low level thereof may be a ground voltage VSS. The level shifter 402 may output an output signal OUT having the same logic level as the first control signal PVEB and an inverted output signal OUTB having a logic level opposite to that of the first control signal PVEB. For example, the logic high level of each of the output signal OUT and the inverted output signal OUTB output from the level shifter 402 may be equal to a high voltage VPPE, and a logic low level thereof may be a ground voltage VSS. The high voltage VPPE may be set to be significantly higher than the external power supply voltage VEXT.

In one embodiment, the high voltage VPPE may be provided outside the memory device 200 or generated in a high voltage generator circuit inside the memory device 200.

For example, the high voltage generator circuit may generate the high voltage VPPE by using n-stage charge pumps (n is an integer of 2 or more) including capacitors coupled to clock signals, based on the external power supply voltage VEXT. For example, the high voltage generator circuit may be a charge pump circuit or a VPP voltage generator included in the memory device 200.

The transfer gate 401 may transmit an output of the first comparator 321 as a first drive control signal VEBa in response to the output signal OUT and the inverted output signal OUTB output from the level shifter 402. When the memory device 200 is in the active mode, the transfer gate 401 may provide the output of the first comparator 321 as the first drive control signal VEBa in response to the output signal OUT having the logic low level and the inverted output signal OUTB having the logic high level.

The first PMOS transistor 403 and the second NMOS transistor 404 may be connected in series between a high voltage VPPE line and a first driving control signal VEBa line. The inverted output signal OUTB output from the level shifter 402 may be connected to a gate of the first PMOS transistor 403, and the second NMOS transistor 404 may be configured as a diode-type transistor in which a gate and a source are connected to each other. In an embodiment, the second NMOS transistor 404 may be omitted. For example, the second NMOS transistor 404 may be omitted depend on a voltage level of the high voltage VPPE.

The high voltage VPPE is applied to the transistors of the transfer gate 401, the gate of the first PMOS transistor 403 and/or the gate of the second NMOS transistor 404 and thus these transistors may be embodied as high-voltage transistors. For example, the transistors of the transfer gate 401, the first PMOS transistor 403 and the second NMOS transistor 404 may be embodied as high-voltage transistors, which are thick gate oxide films.

When the memory device 200 is in the active mode, the first PMOS transistor 403 may be turned off in response to the inverted output signal OUTB having the logic high level output from the level shifter 402, and the first comparator 321 may be enabled to compare the reference voltage VREFA and the first internal power supply voltage VINTAa with each other.

The first comparator 321 may output a first drive control signal VEBa having a relatively low voltage when the first internal power supply voltage VINTAa is lower than the reference voltage VREFA. The first drive transistors 331 to 334 may be turned on by the first drive control signal VEBa having a relatively low voltage, and an amount of current may be supplied to the first internal power supply voltage VINTAa line through the first drive transistors 331 to 334 that are turned-on. The first internal power supply voltage VINTAa may increase according to the amount of current of the first driving transistors 331 to 334 that are turned-on. The amount of current supplied to the first internal power supply voltage VINTAa line may be used for the sensing operation of the sense amplifier unit 2085. For example, the first internal power supply voltage VINTAa may be applied to a LA line of bit line sense amplifiers of the sense amplifier unit 2085. Accordingly, the sensing operation of the sense amplifier unit 2085 may be constantly performed.

Conversely, when the internal power supply voltage VINTA is higher than the reference voltage VREFA, the first comparator 321 may output a first drive control signal VEBa having a relatively high voltage and the first drive transistors 331 to 334 may be turned off.

Through repetitively turning the first drive transistors 331 to 334 on or off, a voltage equal to the reference voltage VREFA may be generated while a constant current is supplied from the first internal power supply voltage VINTAa during the sensing operation of the sense amplifier unit 2085.

When the memory device 200 is in the standby mode (e.g., precharge mode, power down mode, deep power down mode etc.), the first transistor 323 may be turned off and the first comparator 321 may be disabled by the first control signal PVEB having the logic high level. The first PMOS transistor 403 may be turned on in response to the inverted output signal OUTB having the logic low level output from the level shifter 402. The first drive control signal VEBa may be output as a voltage that is lower by a threshold voltage $V_T$ of the second NMOR transistor 404 than the high voltage VPPE by the first PMOS transistor 403 that is turned-on and the second NMOS transistor 404 of a diode-type.

For convenience of explanation, when the first PMOS transistor 403 is turned on, the voltage of the first drive control signal VEBa may be regarded as the high voltage VPPE because the voltage is considerably higher than the external power supply voltage VEXT. The first drive transistors 331 to 334 may be completely turned off by the first drive control signal VEBa, which is substantially the same as the high voltage VPPE and applied to the gates thereof. Because the first drive transistors 331 to 334 are completely turned off, no leakage current may flow through the first drive transistors 331 to 334. Accordingly, the voltage of the first internal power supply voltage VINTAa line may not increase as described above with respect to the voltage generator circuitry 2005 of FIG. 3 and thus the current sink unit 372 of FIG. 3, which continuously supplies a constant current, is not needed to reduce the voltage of the first internal power supply voltage VINTAa line.

Although not illustrated in drawings the first internal voltage generator circuit 310 may be controlled in response to the bank address BANK_ADDR.

The second drive control circuit 370a of the second internal voltage generator circuit 350 may include a second drive transistor 371 connected between the external power supply voltage VEXT line and the second internal power supply voltage VINTAs line. The second drive transistor 371 may be a PMOS transistor in which an output of the second comparator 361 is connected to a gate thereof. When the second internal power supply voltage VINTAs is lower than the reference voltage VREFA, the second drive transistor 371 may be turned on by an output signal having a relatively low voltage of the second comparator 361 and the voltage of the second internal power supply voltage VINTAs line may be increased through the second drive transistor 371 that is turned-on. Conversely, when the second internal power supply voltage VINTAs is higher than the reference voltage VREFA, an output signal having a relatively high voltage may be output from the second comparator 361 and the second drive transistor 371 may be turned off.

In example embodiments, a size (e.g., width/length) of the second drive transistor 371 may be less than a size of the first drive transistors 331 to 334. For example, the size of the first drive transistors 331 to 334 may be several ten or hundred times greater than the size of the second drive transistor 371.

When the memory device 200 is in the active mode, the second internal power supply voltage VINTAs generated by the second internal voltage generator circuit 350 may be output and used as the internal power supply voltage VINTA.

When the memory device 200 is in the standby mode, the second internal power supply voltage VINTAs generated by the second internal voltage generator circuit 350 may be output and used as the internal power supply voltage VINTA.

Figure 5:
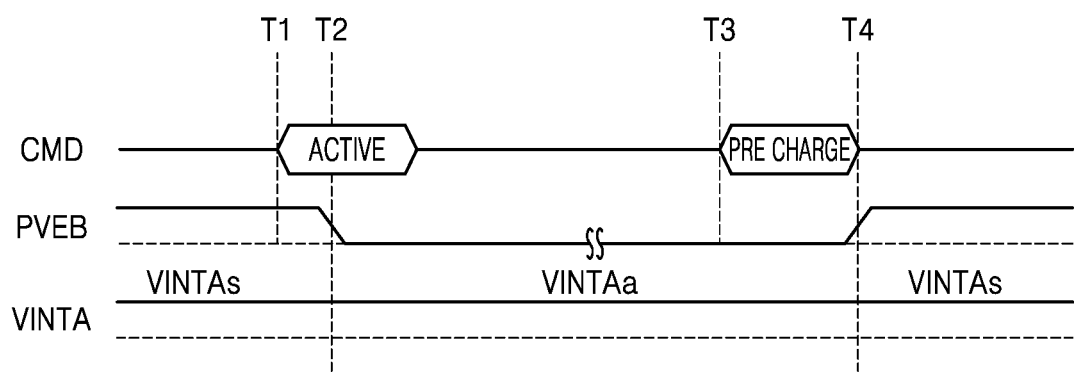
FIG. 5 is a timing diagram illustrating an operation of a voltage generator circuitry according to example embodiments of the inventive concept.

FIG. 5 is a timing diagram illustrating an operation of a voltage generator circuitry according to example embodiments of the inventive concept. FIG. 5 illustrates generating an internal power supply voltage VINTA in response to a first control signal PVEB output based on a command CMD from the memory device 200 of FIG. 2. It should be noted that timing diagrams described in the inventive concept are not necessarily illustrated to scale.

Referring to FIGS. 1, 2, 4 and 5, at a time T1, an active command ACTIVE may be received by the memory device 200. The active command ACTIVE may be provided from a processor of the host device 100 to instruct to write data to or read data from the memory device 200 while the host device 100 executes a specific task or process.

At a time T2, a first control signal PVEB may be activated to a logic low level in response to the active command ACTIVE. Based on the first control signal PVEB having the logic low level, the first comparator 321 of the first internal voltage generator circuit 310 may be enabled and compare the reference voltage VREFA to the first internal power supply voltage VINTAa, and the level shifter 402 may output an output signal OUT having the ground voltage VSS and output an inverted output signal OUTB having the high voltage VPPE. In this case, the first internal voltage generator circuit 310 may generate the first internal power supply voltage VINTAa maintained to be the same as the reference voltage VREFA while supplying a constant current during the sensing operation of the sense amplifier unit 2085, and output the first internal power supply voltage VINTAa as an internal power supply voltage VINTA.

Before the first control signal PVEB is activated to the logic low level at the time T2, the memory device 200 may operate in the standby mode. In this case, the internal power supply voltage VINTA may be output as a second internal power supply voltage VINTAs.

At a time T3, a precharge command PRECHARGE may be received by the memory device 200. The precharge command PRECHARGE may be provided from the processor of the host device 100 to instruct the memory device 200 to operate in the standby mode as a precharge mode (or, a precharge operation).

At a time T4, the first control signal PVEB may be deactivated to a logic high level in response to the precharge command PRECHARGE. The memory device 200 may perform a precharge operation based on the precharge command PRECHARGE. For example, the control logic 2010 of the memory device 200 may deactivate the sense amplifier unit 2085. Based on the first control signal PVEB having the logic high level, the first comparator 321 of the first internal voltage generator circuit 310 may be disabled, and the level shifter 402 may output an output signal OUT having a high voltage VPPE and an inverted output signal OUTB having a ground voltage VSS. Accordingly, the first drive transistors 331 to 334 of the first internal voltage generator circuit 310 may be completely turned off by a first drive control signal VEBa having a voltage which is substantially the same as or slightly less than the high voltage VPPE applied to the gates thereof. Because the first drive transistors 331 to 334 are completely turned off, no leakage current may flow through the first drive transistors 331 to 334. In this case, the second internal power supply voltage VINTAs generated by the second internal voltage generator circuit 350 may be output and used as the internal power supply voltage VINTA.

Figure 6:
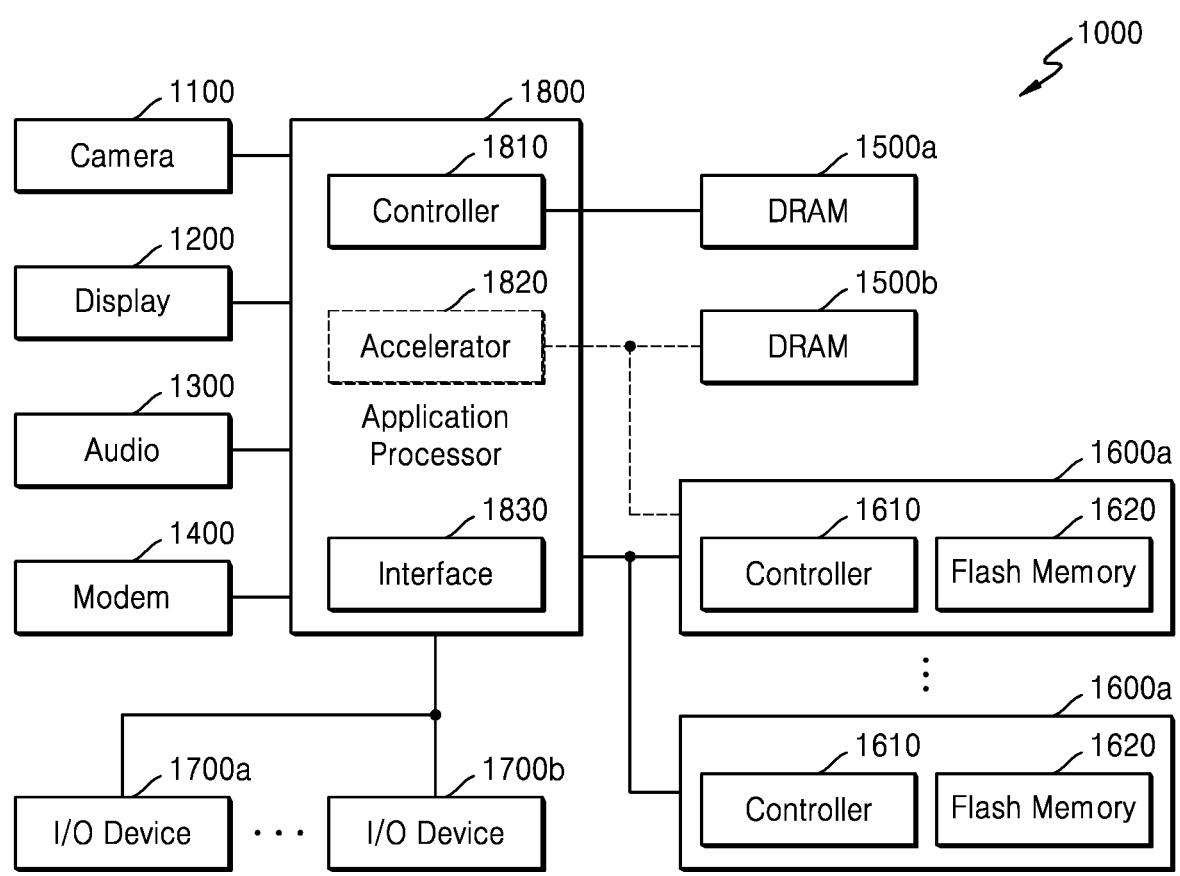
FIG. 6 is a block diagram of a mobile system to which a memory device according to example embodiments of the inventive concept is applied.

FIG. 6 is a block diagram of a mobile system 1000 to which a memory device according to example embodiments of the inventive concept is applied.

Referring to FIG. 6, the mobile system 1000 may include a camera 1100, a display 1200, an audio processor 1300, a modem 1400, DRAMs 1500a and 1500b, storage devices 1600a and 1600b, input/output (I/O) devices 1700a and 1700b, and an application processor (AP) 1800. The mobile system 1000 may be embodied as a laptop computer, a mobile phone, a smart phone, a tablet personal computer (PC), a wearable device, a healthcare device, or an Internet-of-Things (IoT) device. Alternatively, the mobile system 1000 may be embodied as a server or a personal computer.

The camera 1100 may obtain a still image or a moving picture under control of a user. Capabilities of the camera 100 are increasing, for example, due to launching smart-phone applications for identifying images/videos obtained by the camera 1100 and notifying information related thereto, converting an image into text and storing the text, and providing a text or audio translation from a foreign-language image The display 1200 may be embodied in various forms such as a liquid crystal display (LCD), an organic light-emitting diode (OLED) display, an active matrix OLED (AM-OLED) display, a plasma display panel (PDP), and the like. In another embodiment, the display 1200 has a touch screen function and thus may be used as an input device of the mobile system 1000.

The audio processor 1300 is capable of processing audio data in the storage devices 1600a and 1600b or network content. For example, the audio processor 1300 may perform various processes, such as coding/decoding, amplification, and noise filtering, on audio data.

The modem 1400 is a device that modulates a signal and transmits the modulated signal to transmit/receive wired/wireless data, and demodulates the modulated signal so that a receiving side may restore an original signal. The I/O devices 1700a and 1700b may include devices for providing a digital input and/or output function, such as a universal serial bus (USB) or storage, a digital camera, a secure digital (SD) card, a digital versatile disc (DVD), a network adapter, and a touch screen.

Each of the storage devices 1600a and 1600b may include a memory controller 1610 and a flash memory 1620.

The AP 1800 controls overall operations of the mobile system 1000. In detail, the AP 1800 may control the display 1200 to display part of content stored in the storage devices 1600a and 1600b. When user input is received via the I/O devices 1700a and 1700b, the AP 1800 may perform a control operation corresponding to the user input.

The AP 1800 may be provided as a system-on-chip (SoC) for driving an application program, an operating system (OS), and the like. In addition, the AP 1800 and other semiconductor components, for example, the DRAM 1500a, the flash memory 1620 and/or the memory controller 1610 may be mounted using various types of packages. That is, they may be mounted using a package, e.g., a Package-on-Package (PoP), Ball Grid Arrays (BGAs), a Chip-Scale Package (CSP), a System-In-Package (SIP), a Multi-Chip Package (MCP), a Wafer-level Fabricated Package (WFP), or a Wafer-level processed Stack Package (WSP). A kernel of the operating system running in the AP 1800 may include an I/O scheduler and a device driver for controlling the storage devices 1600a and 1600b. The device driver may control access performance of the storage devices 1600a and 1600b by referring to the number of synchronous queues managed by the I/O scheduler or control a CPU mode inside a SoC, Dynamic Voltage and Frequency Scaling (DVFS) level, etc.

In one embodiment, the AP 1800 may include an accelerator block which is a dedicated circuit for artificial intelligence (AI) data operations or an accelerator chip 1820 may be provided separately from the AP 1800. Accordingly, the DRAM 1500b may be additionally mounted on the accelerator block or the accelerator chip 1820. The accelerator is a functional block dedicated to perform specific functions of the AP 1800, and may include a graphics processing unit (GPU) dedicated for graphics processing, a neural processing unit (NPU) dedicated for AI calculation and inference, and a data processing unit (DPU) dedicated for data transmission.

In one embodiment, the mobile system 1000 may include the DRAMs 1500a and 1500b. In one embodiment, the AP 1800 may include a controller 1810 therein and thus the DRAM 1500a may be directly connected to the AP 1800. The AP 1800 may control the DRAMs 1500a and 1500b through commands and a mode register set (MRS) conforming to the Joint Electron Device Engineering Council (JEDEC) standard or establish communication by DRAM interface protocol to use vendor-specific functions such as low voltage/high speed/reliability and a Cyclic Redundancy Check (CRC)/Error Correction Code (ECC) function. For example, the AP 1800 may communicate with the DRAM 1500a with an interface conforming to the JEDEC standard such as LPDDR4 or LPDDR5, and the accelerator block or the accelerator chip 1820 may establish communication by setting a new DRAM interface protocol to control the DRAM 1500b for accelerator having a higher bandwidth than that of the DRAM 1500a.

Although only the DRAMs 1500a and 1500b are illustrated in FIG. 6, the inventive concept is not limited thereto, and various memories such as PRAM, SRAM, MRAM, RRAM, FRAM, and hybrid RAM may be used when a bandwidth, a response rate, and voltage conditions of the AP 1800 or the accelerator chip 1820 are satisfied. The DRAMs 1500a and 1500b have smaller latency and bandwidth than those of the I/O devices 1700a and 1700b or the storage devices 1600a and 1600b. The DRAMs 1500a and 1500b are initialized and the operating system and application data are loaded thereto when the mobile system 1000 is powered on and thus may be used as temporary storage for the operating system and the application data or a space for execution of various software codes.

The four fundamental arithmetic operations, i.e., addition, subtraction, multiplication and division, vector operations, address operations, or Fast Fourier Transform (FFT) operations may be performed in the DRAMs 1500a and 1500b. In addition, a functions used for inference may be performed in the DRAMs 1500a and 1500b. Here, the inference may be performed by a deep learning algorithm using an artificial neural network. The deep learning algorithm may include a training operation of training a model through various data and an inference operation of identifying data with the trained model. Examples of the function used for inference may include a hyperbolic tangent function, a sigmoid function, a Rectified Linear Unit (ReLU) function, and the like.

In one embodiment, an image obtained by a user through the camera 1100 may be signal-processed and stored in the DRAM 1500b, and the accelerator block or the accelerator chip 1820 may perform an AI data operation to identify data by using data stored in the DRAM 1500b and the function used for inference.

In one embodiment, the mobile system 1000 may include a plurality of flash memories 1620 having a larger capacity than those of the DRAMs 1500a and 1500b.

In one embodiment, the accelerator block or the accelerator chip 1820 may perform the training operation and the AI data operation by using storage devices 1600a and 1600b. In one embodiment, the training operation and the inference AI data operation may be more efficiently performed by the AP 1800 and/or the accelerator chip 1820 by using an operation device included in each of the storage device 1600a and 1600b.

In another embodiment, the AP 1800 may include an interface 1830 and thus the storage devices 1600a and 1600b may be directly connected to the AP 1800. For example, the AP 1800 may be embodied as a SoC, the storage device 1600a may be embodied as a separate chip, and the AP 1800 and the storage device 1600a may be assembled in one package. However, the inventive concept is not limited thereto and the storage devices 1600a and 1600b may be electrically connected to the mobile system 1000 through a connection.

The storage devices 1600a and 1600b may store pictures obtained by the camera 1100 or data received through a data network. For example, augmented reality/virtual reality, high-definition (HD) or ultra-high-definition (UHD) content may be stored.

For example, the DRAMs 1500a and 1500b may correspond to the memory device 200 of FIG. 1. The DRAMs 1500a and 1500b may include the memory cell array 2080 which includes a plurality of memory blocks in which a plurality of memory cells are connected to word lines and bit lines arranged in rows and columns, and the voltage generator circuitry 2005 which suppresses leakage current when an internal power supply voltage is generated. The voltage generator circuitry 2005 may generate a first internal power supply voltage VINTAa from an external power supply voltage VEXT when the DRAMs 1500a and 1500b are in the active mode, generate a second internal power supply voltage VINTAs from the external power supply voltage VEXT when the DRAMs 1500a and 1500b are in the standby mode, and provide the first internal power supply voltage VINTAa or the second internal power supply voltage VINTs to an internal power supply voltage VINTA line. In the standby mode, the voltage generator circuitry 2005 may block generation of the first internal power supply voltage VINTAa and suppress leakage current by using a high voltage VPPE higher than the external power supply voltage VEXT.

While the inventive concept has been particularly shown and described with reference to embodiments thereof, it will be understood that various changes in form and details may be made therein without departing from the spirit and scope of the following claims.

What is claimed is:

1. A memory device for performing an operating mode according to a command, the memory device comprising:
   a memory cell array including a plurality of memory blocks which each including a plurality of memory cells connected to word lines and bit lines arranged in rows and columns, the memory cell array being configured to perform a write operation or a read operation on the plurality of memory cells by using an internal power supply voltage provided on an internal power supply voltage line; and
   a voltage generator circuitry configured to:

generate a first internal power supply voltage from an external power supply voltage when the memory device is in an active mode,
generate a second internal power supply voltage from the external power supply voltage when the memory device is in a standby mode, and
provide the first internal power supply voltage or the second internal power supply voltage to the internal power supply voltage line,
wherein, when the memory device is in the standby mode, the voltage generator circuitry blocks generation of the first internal power supply voltage by using a first voltage higher than the external power supply voltage, and
wherein the voltage generator circuitry comprises:
a first internal voltage generator circuit configured to compare the first internal power supply voltage with a reference voltage in response to a first drive control signal generated based on a first control signal activated in the active mode, and generate the first internal power supply voltage to be equal to the reference voltage; and
a second internal voltage generator circuit configured to compare the second internal power supply voltage with the reference voltage and generate the second internal power supply voltage to be equal to the reference voltage, in the active mode and the standby mode.

2. The memory device of claim 1, wherein the voltage generator circuitry further comprises:
a switch circuit configured to provide the second internal power supply voltage to the internal power supply voltage line in response to a second control signal in the standby mode.

3. The memory device of claim 2, wherein the switch circuit comprises a P-type MOS (PMOS) transistor connected between a first internal power supply voltage line and a second internal power supply voltage line, and
wherein the second control signal is supplied to a gate of the PMOS transistor.

4. The memory device of claim 1, wherein the first internal voltage generator circuit comprises:
an inverter configured to receive the first control signal;
an N-type metal oxide semiconductor (NMOS) transistor including a gate receiving an output signal of the inverter and a source connected to a ground voltage;
a comparator configured to:
be driven by the external power supply voltage and the ground voltage,
compare the first internal power supply voltage with the reference voltage, and
output an output as the first drive control signal when the comparator is electrically connected to the ground voltage through the NMOS transistor; and
a plurality of P-type MOS (PMOS) transistors connected in parallel between an external power supply voltage line and a first internal power supply voltage line,
wherein the first drive control signal is provided to gates of the plurality of PMOS transistors.

5. The memory device of claim 1, wherein the first internal voltage generator circuit comprises:
an inverter configured to receive the first control signal;
a first N-type metal oxide semiconductor (NMOS) transistor including a gate receiving an output signal of the inverter and a source connected to a ground voltage;
a comparator configured to:
be driven by the external power supply voltage and the ground voltage, and
compare the first internal power supply voltage with the reference voltage when the comparator is electrically connected to the ground voltage through the first NMOS transistor;
a level shifter configured to receive the first control signal and output an output signal having the same logic level as the first control signal and an inverted output signal having a logic level opposite to the logic level of the first control signal, wherein logic high levels of the output signal and the inverted output signal are equal to or higher than the first voltage;
a transfer gate configured to output an output signal of the comparator as the first drive control signal in response to the output signal and the inverted output signal of the level shifter;
a first P-type MOS (PMOS) transistor and a second NMOS transistor connected in series between a high voltage line and a first drive control signal line; and
a plurality of second PMOS transistors connected in parallel between an external power supply voltage line and a first internal power supply voltage line, wherein the first drive control signal is provided to gates of the plurality of second PMOS transistors,
wherein the inverted output signal output from the level shifter is connected to a gate of the first PMOS transistor, and
wherein the second NMOS transistor comprises a diode-type transistor in which a gate and a source are connected to each other.

6. The memory device of claim 5, wherein each of transistors of the transfer gate, the first PMOS transistor, and the second NMOS transistor comprises a high-voltage transistor in which a gate oxide film is thicker than that of the first NMOS transistor.

7. The memory device of claim 1, wherein the second internal voltage generator circuit comprises:
an N-type metal oxide semiconductor (NMOS) transistor including a gate receiving the reference voltage and a source connected to a ground voltage;
a comparator configured to:
be driven by the external power supply voltage and the ground voltage, and
compare the second internal power supply voltage with the reference voltage when the comparator is electrically connected to the ground voltage through the NMOS transistor; and
a P-type MOS (PMOS) transistor connected between an external power supply voltage line and a second internal power supply voltage line, wherein an output signal of the comparator is connected to a gate of the PMOS transistor.

8. The memory device of claim 1, wherein the first voltage is generated from a high voltage that is provided from an outside of the memory device or generated by a high voltage generator circuit included in the memory device.

9. An operating method of a memory device configured to generate an internal power supply voltage, the method comprising:
when the memory device is in an active mode, generating first and second internal power supply voltages from an external power supply voltage; and
when the memory device is in a standby mode, generating the second internal power supply voltage from the external power supply voltage and blocking generation of the first internal power supply voltage by using a first voltage higher than the external power supply voltage, wherein the generating of the second internal power supply voltage, comprises:
comparing the second internal power supply voltage with a reference voltage by a second comparator driven by the external power supply voltage and a ground voltage; and
providing an output of the second comparator to a second internal power supply voltage line.

10. The method of claim 9, wherein the generating of the first internal power supply voltage, comprises:
activating a first control signal according to an active command;
comparing the first internal power supply voltage with the reference voltage by a first comparator responding to the first control signal;
outputting, by a level shifter to which the first control signal is input, an output signal having the same logic level as the first control signal and an inverted output signal having a logic level opposite to the logic level of the first control signal, wherein, when the output signal and the inverted output signal are at a logic high level, a voltage level of the output signal and the inverted output signal is higher than a voltage level of the external power supply voltage;
outputting an output signal of the first comparator as a first drive control signal in response to the output signal and the inverted output signal of the level shifter;
generating the first internal power supply voltage in response to the first drive control signal; and
outputting the first internal power supply voltage as the internal power supply voltage.

11. The method of claim 10, further comprising performing a sensing operation of a sense amplifier unit of the memory device by using the internal power supply voltage.

12. The method of claim 10, wherein the generating of the first internal power supply voltage comprises generating the first internal power supply voltage to be equal to the reference voltage.

13. The method of claim 10, wherein the blocking of the generation of the first internal power supply voltage, comprises:
applying the first drive control signal having the first voltage to gates of a plurality of PMOS transistors connected between an external power supply voltage line and a first internal power supply voltage line; and
completely turning the plurality of PMOS transistors off in response to the first drive control signal.

14. The method of claim 10, wherein the first voltage is generated from a high voltage that is provided from an outside of the memory device or generated by a high voltage generator circuit included in the memory device.

15. The method of claim 9, further comprising generating the second internal power supply voltage to be equal to the reference voltage.

16. A voltage generator circuitry for generating an internal power supply voltage of a memory device, the voltage generator circuitry comprising:
a first internal voltage generator circuit configured to:
compare a first internal power supply voltage with a reference voltage in response to a first drive control signal generated based on a first control signal activated in an active mode of the memory device, and
generate the first internal power supply voltage to be equal to the reference voltage;
a second internal voltage generator circuit configured, in the active mode and a standby mode of the memory device, to:
compare a second internal power supply voltage with the reference voltage, and
generate the second internal power supply voltage to be equal to the reference voltage; and
a switch circuit configured to provide the first internal power supply voltage or the second internal power supply voltage to an internal power supply voltage line as the internal power supply voltage in response to a second control signal activated in the standby mode of the memory device.

17. The voltage generator circuitry of claim 16, wherein, when the memory device is in the standby mode, the voltage generator circuitry blocks generation of the first internal power supply voltage by using a first voltage higher than an external power supply voltage applied to the memory device.

18. The voltage generator circuitry of claim 17, wherein the first internal voltage generator circuit comprises:
an inverter configured to receive the first control signal;
a first N-type metal oxide semiconductor (NMOS) transistor including a gate receiving an output signal of the inverter and a source connected to a ground voltage;
a comparator configured to:
be driven by the external power supply voltage and the ground voltage, and
compare the first internal power supply voltage with the reference voltage when the comparator is electrically connected to the ground voltage through the first NMOS transistor;
a level shifter configured to receive the first control signal and output an output signal having the same logic level as the first control signal and an inverted output signal having a logic level opposite to the logic level of the first control signal, wherein logic high levels of the output signal and the inverted output signal are equal to or higher than the first voltage;
a transfer gate configured to an output signal of the comparator as the first drive control signal in response to the output signal and the inverted output signal of the level shifter;
a first P-type MOS (PMOS) transistor and a second NMOS transistor connected in series between a high voltage line and a first drive control signal line; and
a plurality of second PMOS transistors connected in parallel between an external power supply voltage line and a first internal power supply voltage line, wherein the first drive control signal is provided to gates of the plurality of second PMOS transistors,
wherein the inverted output signal output from the level shifter is connected to a gate of the first PMOS transistor, and
wherein the second NMOS transistor comprises a diode-type transistor in which a gate and a source are connected to each other.

19. The voltage generator circuitry of claim 16, wherein the first internal voltage generator circuit includes a plurality of first P-type metal oxide semiconductor (PMOS) transistors connected to an external power supply voltage and configured to generate the first internal power supply voltage,
wherein the second internal voltage generator circuit includes a second PMOS transistor connected to the external power supply voltage and configured to generate the second internal power supply voltage, and wherein a size of the plurality of first PMOS transistors is greater than a size of the second PMOS transistor.

* * * * *